United States Patent
Hong

(10) Patent No.: US 8,174,121 B2
(45) Date of Patent: May 8, 2012

(54) SEMICONDUCTOR DEVICE AND MANUFACTURING METHOD THEREOF

(75) Inventor: Min Dae Hong, Seoul (KR)

(73) Assignee: Dongbu Electronics Co. Ltd., Seoul (KR)

( * ) Notice: Subject to any disclaimer, the term of this patent is extended or adjusted under 35 U.S.C. 154(b) by 886 days.

(21) Appl. No.: 12/199,155

(22) Filed: Aug. 27, 2008

(65) Prior Publication Data

US 2009/0020875 A1    Jan. 22, 2009

Related U.S. Application Data

(62) Division of application No. 11/320,890, filed on Dec. 30, 2005, now Pat. No. 7,432,190.

(30) Foreign Application Priority Data

Nov. 15, 2005   (KR) .................. 10-2005-0109010

(51) Int. Cl.
*H01L 23/532* (2006.01)
(52) U.S. Cl. ............... 257/741; 257/740; 257/E23.161; 438/650; 438/686; 438/622
(58) Field of Classification Search .......... 257/741, 257/740, E23.161; 438/650, 686, 622, 623, 438/624, 672, 673
See application file for complete search history.

(56) References Cited

U.S. PATENT DOCUMENTS

| | | | | |
|---|---|---|---|---|
| 6,133,144 A | * | 10/2000 | Tsai et al. | 438/634 |
| 6,184,143 B1 | * | 2/2001 | Ohashi et al. | 438/697 |
| 6,468,894 B1 | * | 10/2002 | Yang et al. | 438/622 |
| 2005/0170642 A1 | | 8/2005 | Hineman et al. | |

FOREIGN PATENT DOCUMENTS

| | | |
|---|---|---|
| KR | 10-2003-0054782 | 7/2003 |
| KR | 10-2004-0053461 | 6/2004 |
| KR | 10-2005-0069586 | 7/2005 |

OTHER PUBLICATIONS

Office Action from the Korean Intellectual Property Office, dated Nov. 14, 2006, in counterpart Korean Patent Application No. 10-2005-0109010.

* cited by examiner

*Primary Examiner* — Thinh T Nguyen
(74) *Attorney, Agent, or Firm* — Finnegan, Henderson, Farabow, Garrett & Dunner LLP

(57) ABSTRACT

A semiconductor device is provided. The semiconductor device includes a substrate in which a first interlayer insulation layer having a first via hole and a first trench is formed. The semiconductor device also includes a first via plug and a first metal line respectively formed by filling the first via hole and the first trench with a first metal, a predetermined scratch being formed on the first metal line; and a second via plug a second metal line respectively formed by filling a second via hole and a second trench with a second metal, the second metal lines being separated.

5 Claims, 4 Drawing Sheets

SEMICONDUCTOR DEVICE AND MANUFACTURING METHOD THEREOF

This is a divisional of application Ser. No. 11/320,890, filed Dec. 30, 2005, now U.S. Pat. No. 7,432,190 which claims the benefit of priority to Korean Application No. 10-2005-0109010, filed on Nov. 15, 2005. The entire contents of both of these applications are incorporated herein by reference in their entirety.

BACKGROUND OF THE INVENTION

1. Field of the Invention

The present invention relates to a semiconductor device and a manufacturing method thereof, and more particularly, to a metal line of a semiconductor device and a method of forming the same.

2. Description of the Related Art

A related art method of manufacturing a semiconductor device will be described below with reference to FIGS. 1A and 1B.

Referring to FIG. 1A, a first interlayer insulation layer 110 is formed on a substrate 100. The first interlayer insulation layer 110 is etched to form a via hole and a trench. Then, a first via hole and a first metal line 120 are formed by filling the via hole and the trench with a metal. The first metal line 120 and the first interlayer insulation layer 110 are planarized using a chemical mechanical polishing (CMP) process.

Meanwhile, when the ductility of the metal line 120 is high, scratch 130 often occurs in the surface of the planarized metal line. Specifically, when the metal line is formed of copper (Cu), the scratch 130 occurs much more.

Referring to FIG. 1B, a second interlayer insulation layer 115 is formed by depositing a dielectric material on the first metal line 120 and the first interlayer insulation layer 110.

The second interlayer insulation layer 115 is etched to form a via hole and a trench. Then, a second via plug and a second metal line 140 are formed by filling the via hole and the trench with a second metal.

Since the second interlayer insulation layer 115 is formed along the scratch 130 formed on the surface of the first metal line 120, the scratch 130 causes the formation of notch on the surface of the second interlayer insulation layer 115.

Accordingly, in forming the second metal line 140, a remained metal 145 is formed in the notch, as well as in the via hole and the trench region.

However, the remained metal 145 has a problem that shorts the second metal lines 140.

Also, the shorting due to the remained metal 145 degrades the yield of the semiconductor device.

SUMMARY OF THE INVENTION

Accordingly, the present invention is directed to a semiconductor device and a manufacturing method thereof that substantially obviate one or more problems due to limitations and disadvantages of the related art.

An object of the present invention is to provide a semiconductor device and a manufacturing method thereof, capable of preventing the shorting of metal lines.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor device including: a substrate in which a first interlayer insulation layer having a first via hole and a first trench is formed; a first via plug and a first metal line respectively formed by filling the first via hole and the first trench with a first metal, a predetermined scratch being formed on the first metal line; and a second via plug a second metal line respectively formed by filling a second via hole and a second trench with a second metal, the second metal lines being separated.

In another aspect of the present invention, there is provided a method of manufacturing a semiconductor device, including: preparing a substrate in which a first interlayer insulation layer having a first via hole and a first trench is formed; forming a first via plug and a first metal line by filling the first via hole and the first trench with a first metal; performing a first CMP process of planarizing the first metal line and the first interlayer insulation layer; forming a second interlayer insulation layer on the first metal line and the first interlayer insulation layer; performing a second CMP process of planarizing the second interlayer insulation layer; forming a second via hole and a second trench in the second interlayer insulation layer; forming a second via plug and a second metal line by filling the second via hole and the second trench with a second metal; and performing a third CMP process of planarizing the second metal line and the second interlayer insulation layer.

In a further another aspect of the present invention, there is provided a method of manufacturing a semiconductor device, including: preparing a substrate in which a first interlayer insulation layer having a first via hole and a first trench is formed; forming a first via plug and a first metal line by filling the first via hole and the first trench with a first metal; performing a first CMP process of planarizing the first metal line and the first interlayer insulation layer; forming a second interlayer insulation layer on the first metal line and the first interlayer insulation layer; performing a second CMP process of planarizing the second interlayer insulation layer; forming a third interlayer insulation layer on the second interlayer insulation layer; forming a second via hole and a second trench in the third interlayer insulation layer; forming a second via plug and a second metal line 240 by filling the second via hole and the second trench with a second metal; and performing a third CMP process of planarizing the second metal line and the third interlayer insulation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a manufacturing method thereof according to the embodiments of the present invention will be described in detail with reference to the accompanying drawings.

Embodiment 1

Figure 1A:
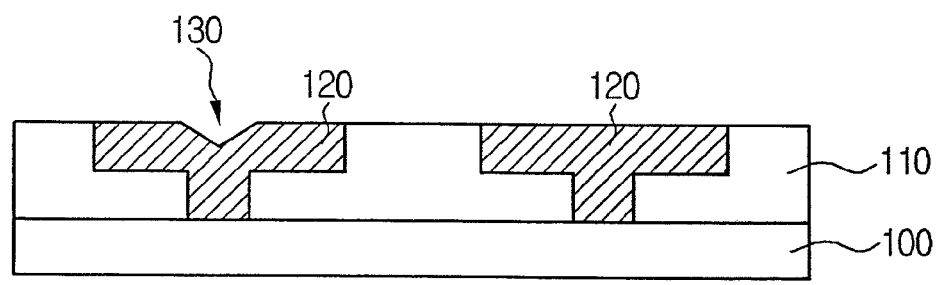
FIGS. 1A and 1B are sectional views illustrating a method of manufacturing a related art semiconductor device.
Figure 1B:
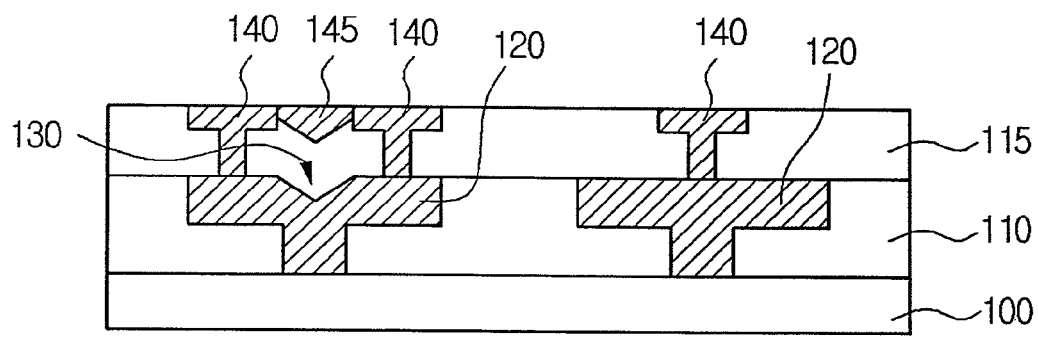
Figure 2:
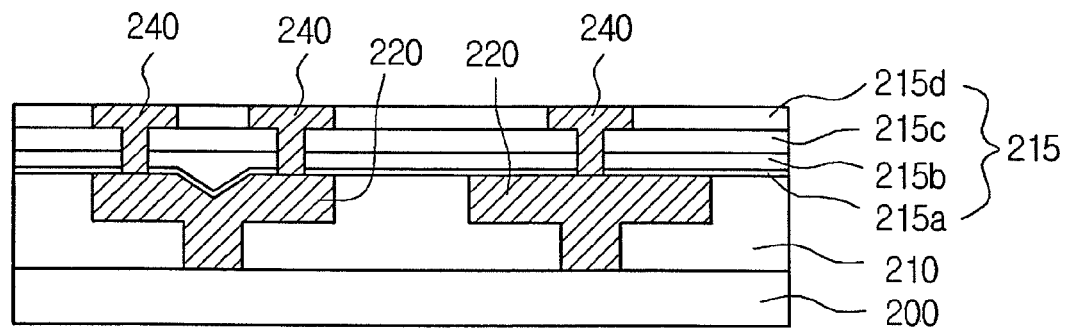
FIG. 2 is a sectional view of a semiconductor device according to a first embodiment of the present invention.

FIG. 2 is a sectional view of a semiconductor device according to a first embodiment of the present invention.

Referring to FIG. 2, the semiconductor device according to the first embodiment of the present invention includes: a substrate 200 where a first interlayer insulation layer 210 having a first via hole and a first trench is formed; a first via plug and a first metal line 220 respectively formed by filling the first via hole and the first trench with a first metal, a predetermined scratch being formed on the first metal line 220; a second interlayer insulation layer 215 formed on the first metal line 220 and the first interlayer insulation layer 210, the second interlayer insulation layer 215 having a plurality of layers, including a second via hole and a second trench, through a plurality of processes; and a second via plug a second metal line 240 respectively formed by filling the second via hole and the second trench with a second metal, the second metal line 240 being separated between the second metals.

The first interlayer insulation layer 210 may include a first etch stop layer formed on the substrate 200, and at least one insulation layer formed on the first etch stop layer.

The second interlayer insulation layer 215 may include a second etch stop layer 215a formed on the first metal line 220 and the first interlayer insulation layer 210, and at least one insulation layer formed on the second etch stop layer.

For example, the second interlayer insulation layer 215 may include the second etch stop layer 215a formed on the first metal line 220 and the first interlayer insulation layer 210, a first insulation layer 215b formed on the second etch stop layer 215a, a second insulation layer 215c formed on the first insulation-layer 215b, and a third insulation layer 215d formed on the second insulation layer 215c. A stack structure of the first to third insulation layers 215b, 215c and 215d will be referred to as the second interlayer insulation layer 215.

The first metal may be copper (Cu) and a notch is not formed on the top of the second interlayer insulation layer 215.

The metal used for filling the first via hole may be equal to or different from the metal used for filling the first trench.

For example, the metal used for filling the first via hole may be copper (Cu) and the metal used for filling the first trench may be aluminum (Al).

Also, the metal used for filling the second via hole may be equal to or different from the metal used for filling the second trench. For example, the metal used for filling the second via hole may be copper (Cu) and the metal used for filling the second trench may be aluminum (Al).

The semiconductor device according to the first embodiment of the present invention may further include a barrier layer formed between the first interlayer insulation layer 210 and the first metal line 220. The barrier layer may be a single layer or a bi-layer formed of material selected from the group consisting of Ti, TiN, Ta, TaN, and a combination thereof. Since such a barrier layer has good adhesive force with respect to the first interlayer insulation layer 210, it increases an adhesive property between the via plug and the first interlayer insulation layer 210.

FIGS. 3A to 3E are sectional views illustrating a method of manufacturing the semiconductor device according to the first embodiment of the present invention.

The manufacturing method according to the first embodiment of the present invention includes: preparing a substrate where a first interlayer insulation layer having a first via hole and a first trench is formed; forming a first via plug and a first metal line by filling the first via hole and the first trench with a first metal; performing a first CMP process of planarizing the first metal line and the first interlayer insulation layer; forming a second interlayer insulation layer on the first metal line and the first interlayer insulation layer; performing a second CMP process of planarizing the second interlayer insulation layer; forming a second via hole and a second trench in the second interlayer insulation layer; forming a second via plug and a second metal line by filling the second via hole and the second trench with a second metal; and performing a third CMP process of planarizing the second metal line and the second interlayer insulation layer.

Figure 3A:
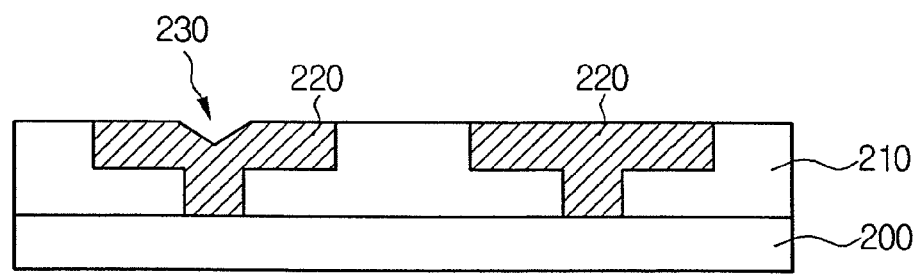
FIGS. 3A to 3E are sectional views illustrating a method of the semiconductor device according to the first embodiment of the present invention.

Referring to FIG. 3A, a first interlayer insulation layer 210 is formed on a substrate 200, and then a first via hole and a first trench are formed in the first interlayer insulation layer 210.

The first trench may be formed in the first interlayer insulation layer 210 before or after the first via hole is formed.

The first interlayer insulation layer 210 may include a first etch stop layer formed on the substrate 200, and at least one insulation layer formed on the etch stop layer.

Next, a first via plug and a first metal line 220 are formed by filling the first via hole and the first trench with a first metal, and then a first CMP process is performed to planarize the first metal line 220 and the first interlayer insulation layer 210.

The metal used for filling the first via hole may be equal to or different from the metal used for filling the first trench.

For example, the metal used for filling the first via hole may be copper (Cu) and the metal used for filling the first trench may be aluminum (Al).

After the first via hole and the first trench are filled with the first metal, an annealing process may be performed to crystallize the first metal.

The manufacturing method according to the first embodiment of the present invention may further include forming a barrier layer between the first interlayer insulation layer 210 and the first metal line 220. The barrier layer may be a single layer or a bi-layer formed of material selected from the group consisting of Ti, TiN, Ta, TaN, and a combination thereof. Since such a barrier layer has good adhesive force with respect to the first interlayer insulation layer 210, it increases an adhesive property between the via plug and the first interlayer insulation layer 210.

Meanwhile, when the ductility of the first metal line 220 is high, scratch 230 often occurs in the surface of the planarized first metal line. Specifically, when the first metal line is formed of copper (Cu), the scratch 230 occurs much more.

Figure 3B:
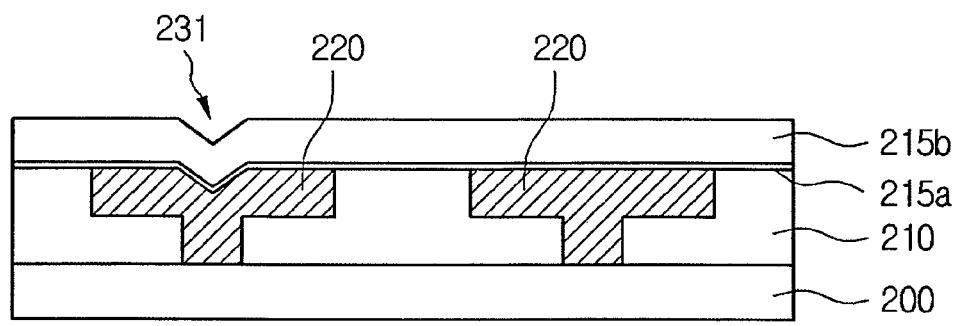

Referring to FIG. 3B, a second etch stop layer 215a is formed on the first metal line 220 and the first interlayer insulation layer 210, and a first insulation layer 215b is formed on the second etch stop layer 215a.

The second etch stop layer 215a may be formed of P—SiN that is a silicon nitride (SiNx) based material, or the like. The second etch stop layer 215a may be 300-1000 Å thick. The second etch stop layer 215a functions to prevent the first metal line 220 from being over-etched in forming a second via hole through an etching process during a process of forming a second metal line 240. Accordingly, the second etch stop layer 215a may be formed of material with different etch selectivity from that of an insulation layer, which will be formed later.

Next, a first insulation layer 215b is formed on the second etch stop layer 215a by a chemical vapor deposition (CVD) process. It is preferable that the first insulation layer 215b is formed thicker than a design target in order to prevent a continuous transfer of the notch 231 formed on the first insulation layer 215a, which is caused by the scratch 230 formed on the first metal line 220.

That is the first insulation layer 215b is formed more thickly than designed for the manufacture of the semiconductor device. The thickness of the first insulation layer 215b can be larger than that of the insulation layer that is polished until the notch 231 formed on the first insulation layer 215b due to the scratch 230 is completely removed by a surface polishing process.

Figure 3C:
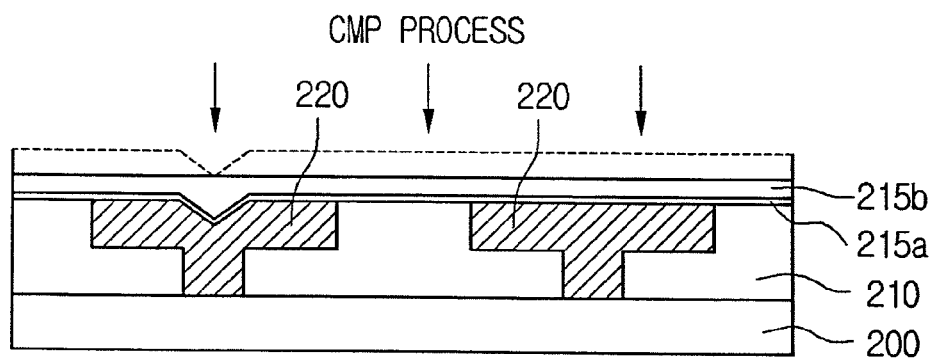

Referring to FIG. 3C, a second CMP process is performed to planarize the first insulation layer 215b. The second CMP process is performed until the notch 231 formed on the surface of the second insulation layer 215b is removed.

The second CMP process may use an oxide CMP (Rox=500) process that can chemically and mechanically polish non-conductive layer rather than conductive metal. Other methods can also be used.

In this embodiment, after forming the first insulation layer 215b, a portion of the first insulation layer 215b is additionally removed by the second CMP process. Therefore, if the first insulation layer 215b is formed to the initially designed thickness, a thickness of the insulation layer is smaller than the design value after the second CMP process. Thus, it is preferable that the first insulation layer 215b is formed more thickly by a thickness to be polished for removing the notch 231.

Figure 3D:
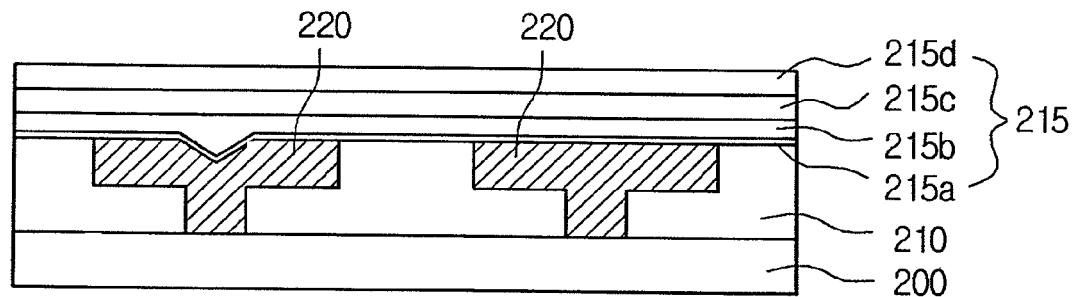

Referring to FIG. 3D, a second insulation layer 215c is formed on the first insulation layer 215b. The second insulation layer 215c may be formed of fluorine (FSG), and so on.

The manufacturing method of the present invention may further include forming a third insulation layer 215d on the second insulation layer 215c.

The third insulation layer 215d may be formed of silane-based material (SiH$_4$), and so on. A stack structure of the first to third insulation layers 215b, 215c and 215d will be referred to as the second interlayer insulation 215.

According to the present invention, the notch 231 formed on the first insulation layer 215b, which is caused by the scratch 230 formed on the surface of the first metal line 220, is completely removed by the second CMP process. Therefore, the surfaces of the second and third insulation layers 215c and 215d are flat.

Figure 3E:
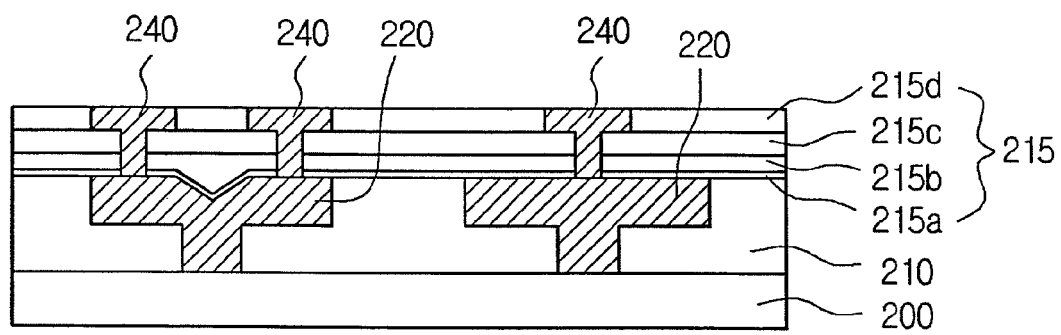

Referring to FIG. 3E, a second via hole and a second trench are formed in the second interlayer insulation layer 215.

The second trench may be formed in the second interlayer insulation layer 215 before or after the second via hole is formed.

A second via plug and a second metal line 240 are formed by filling the second via hole and the second trench with a metal. Then, a third CMP process is performed to planarize the second via plug and the second interconnection 240.

The metal used for filling the second via hole may be equal to or different from the metal used for filling the second trench. For example, the metal used for filling the second via hole may be copper (Cu) and the metal used for filling the second trench may be aluminum (Al).

As described above, the present invention can prevent the continuous transfer of the scratch formed on the surface of the metal line by planarizing the interlayer insulation layer after the process of forming the interlayer insulation layer and before the process of forming the metal line.

Also, the present invention can prevent the shorting between the metal lines, thereby increasing the yield of the semiconductor device.

Embodiment 2

A method of manufacturing a semiconductor device according to a second embodiment of the present invention will be described below with reference to FIG. 4.

Figure 4:
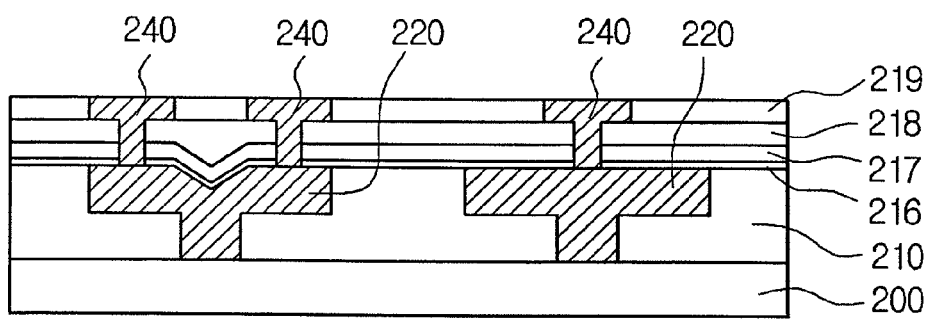
FIG. 4 is a sectional view of a semiconductor device according to a second embodiment of the present invention.

Referring to FIG. 4, the manufacturing method according to the second embodiment of the present invention includes: preparing a substrate 200 where a first interlayer insulation layer 210 having a first via hole and a first trench is formed; forming a first via plug and a first metal line 220 by filling the first via hole and the first trench with a first metal; performing a first CMP process of planarizing the first metal line 220 and the first interlayer insulation layer 210; forming a second interlayer insulation layer 217 on the first metal line 220 and the first interlayer insulation layer 210; performing a second CMP process of planarizing the second interlayer insulation layer 217; forming a third interlayer insulation layer 219 on the second interlayer insulation layer 217; forming a second via hole and a second trench in the third interlayer insulation layer 219; forming a second via plug and a second metal line 240 by filling the second via hole and the second trench with a second metal; and performing a third CMP process of planarizing the second metal line 240 and the third interlayer insulation layer 219.

Compared with the first embodiment of the present invention, the manufacturing method according to the second embodiment of the present invention further includes forming the third interlayer insulation layer 219 after the second interlayer insulation layer 217 is planarized.

Therefore, the second interlayer insulation layer 217 can be formed to be shallower than that of the first embodiment.

Also, the manufacturing method according to the second embodiment of the present invention may further include forming a second etch stop layer 216 on the first metal line 220 and the first interlayer insulation layer 210 after the first CMP process.

In addition, the manufacturing method according to the second embodiment of the present invention may further include forming a fourth interlayer insulation layer 218 on the second interlayer insulation layer 217.

Although not illustrated in detail, the technical sprit of this invention can provide various embodiments. For example, the transfer of the scratch can be prevented by forming the second etch stop layer 216 thickly and then performing the CMP process. Also, the transfer of the scratch can be prevented by forming the third interlayer insulation layer 219 thickly and then performing the CMP process.

For example, in case where the CMP process is performed on the second etch stop layer 216, if the design thickness of the second etch stop layer 216 is 300-1000 Å, the second etch stop layer 216 is formed thickly up to 1300-3000 Å and then the CMP process is performed, so that the notch formed on the surface of the second etch stop layer due to the scratch can be removed.

Also, in case where the CMP process is performed on the third interlayer insulation layer 219, if the design thickness of the third interlayer insulation layer 219 is 1500-3000 Å the third interlayer insulation layer 219 is formed thickly up to 3500-6000 Å and then the CMP process is performed, so that the notch formed on the surface of the third interlayer insulation layer 219 due to the scratch can be prevented.

Although the process of forming one metal line among the semiconductor device manufacturing processes has been described above, the present invention can also be applied to all processes of forming the metal line.

It will be apparent to those skilled in the art that various modifications and variations can be made in the present invention. Thus, it is intended that the present invention covers the modifications and variations of this invention provided they come within the scope of the appended claims and their equivalent.

The invention claimed is:

1. A semiconductor device comprising:
   a substrate in which a first interlayer insulation layer having a first via hole and a first trench is formed;
   a first via plug and a first metal line respectively formed by filling the first via hole and the first trench with a first metal, a predetermined scratch being formed on the first metal line;
   a second insulation layer having a second via hole and a second trench, wherein the second insulation layer is disposed on the first interlayer insulation layer and the first metal line and formed by filling the predetermined scratch; and
   a second via plug and a second metal line respectively formed by filling the second via hole and the second trench with a second metal, the second metal lines being separated,
   wherein the second via plug is in contact with a flat top surface of the first metal line, and
   wherein the predetermined scratch does not overlap with the second via plug in a vertical direction.

2. The semiconductor device according to claim 1, wherein the first interlayer insulation layer comprises:
   a first etch stop layer formed on the substrate; and
   at least one insulation layer formed on the first etch stop layer.

3. The semiconductor device according to claim 1, wherein the second interlayer insulation layer comprises:
   a second etch stop layer formed on the first metal line and the first interlayer insulation layer; and
   at least one insulation layer formed on the second etch stop layer.

4. The semiconductor device according to claim 1, wherein the first metal is copper (Cu).

5. The semiconductor device according to claim 1, wherein the second interlayer insulation layer has no notch on the top surface thereof.

* * * * *